United States Patent [19]

Coutellier et al.

[11] Patent Number: 5,696,447
[45] Date of Patent: Dec. 9, 1997

[54] MAGNETO-RESISTIVE MAGNETIC FIELD SENSOR WITH POLE PIECES AND INCREASED SENSITIVITY

[75] Inventors: Jean-Marc Coutellier, Maurepas; Nicolas Blanchard, Boulogne; Thierry Valet, Viroflay, all of France

[73] Assignee: Thomson-CSF, Paris, France

[21] Appl. No.: 355,893

[22] Filed: Dec. 14, 1994

[30] Foreign Application Priority Data

Dec. 14, 1993 [FR] France ............... 93 14992

[51] Int. Cl.⁶ ............... G11B 5/33; G01R 33/06; G01R 33/02; G01B 5/127
[52] U.S. Cl. ............... 324/252; 338/32 R
[58] Field of Search ............... 324/252, 260; 338/32 R; 360/113

[56] References Cited

U.S. PATENT DOCUMENTS

| | | | |
|---|---|---|---|
| 4,649,447 | 3/1987 | Huang et al. | 324/252 |
| 4,734,644 | 3/1988 | Imakoshi et al. | 324/252 |
| 5,119,025 | 6/1992 | Smith et al. | 324/252 |

FOREIGN PATENT DOCUMENTS

| | | |
|---|---|---|
| 0 534 791 A2 | 3/1993 | European Pat. Off. . |
| 2 169 434 | 7/1986 | United Kingdom . |
| WO 92/01945 | 2/1992 | WIPO . |

*Primary Examiner*—Walter E. Snow
*Attorney, Agent, or Firm*—Oblon, Spivak, McClelland, Maier & Neustadt, P.C.

[57] ABSTRACT

The invention concerns a magneto-resistive magnetic sensor comprising a magneto-resistive element, the resistance of which varies as a function of the applied magnetic field and two pole pieces that collect the magnetic field to be detected so as to concentrate it in the magneto-resistive element, each pole piece being positioned to partially overlap the magneto-resistive element, a current I passing through this magneto-resistive element, wherein the zones of the magneto-resistive element that are overlapped by pole pieces are cut out such that the current that passes through the magneto-resistive element is located in a zone in the air gap between the two pole pieces.

7 Claims, 3 Drawing Sheets

MAGNETO-RESISTIVE MAGNETIC FIELD SENSOR WITH POLE PIECES AND INCREASED SENSITIVITY

BACKGROUND OF THE INVENTION

This invention concerns magneto-resistive magnetic field sensors, and particularly magneto-resistive magnetic field sensors in which the magnetic field to be detected has to be collected with pole pieces. These sensors are used, for example, as read heads or magnetometers. They may be of the single-layer or multi-layer type. This invention will be described specifically for single-layer type sensors. However, as will become clear later, this invention also concerns multi-layer type sensors.

Magneto-resistive magnetic field sensors, referred to in this document as magneto-resistive sensors, use the phenomenon by which the value of the pure resistance of some materials varies as a function of the intensity of the magnetic field applied to them. The variation of the resistance can be detected by normal methods, and used to measure the variation of the magnetic field.

In general, magneto-resistive sensors according to the invention include a magneto-resistive element through which a current passes, and two pole pieces.

As mentioned above, these two pole pieces collect the magnetic field to be detected.

DESCRIPTION OF THE PRIOR ART

As is well known to the expert in the field, the variation of the resistivity, $\rho$, of a material sensitive to the magneto-resistive effect, is a function of the angle $\alpha$, between the direction of the current, I, passing through this material and the direction of magnetization of the material, is given by the following formula:

$\rho = \rho_0(1 + \Delta\rho/\rho_0 \cos^2\alpha)$ where $\rho_0$ is the resistivity of the material in the absence of a magnetic field.

The variation of resistivity and consequently the variation of the resistance are then maximum for $\alpha=45°$.

These are the conditions of use of magneto-resistive sensors designed to have a high detection sensitivity to magnetic field variations.

In prior art, the two pole pieces partially overlap the magneto-resistive element.

This overlap is made to optimize the transmission of magnetic flux to the magneto-resistive element.

However, this type of device has disadvantages. The magnetic field is concentrated mainly in the part of the magneto-resistive element between the air gap of the two pole pieces, but the current passing through the element is uniformly distributed in it. The result is that the sensitivity is not as high as was hoped.

This invention does not have this disadvantage.

SUMMARY OF THE INVENTION

The purpose of this invention is a magneto-resistive magnetic field sensor wherein areas of the magneto-resistive element that overlap with pole pieces are cut out to concentrate the current that passes through the magneto-resistive element within an area inside the air gap between the two pole pieces.

Therefore, an advantage of the invention is the improved sensitivity of the magneto-resistive sensors necessary to collect the magnetic field to be detected using pole pieces.

BRIEF DESCRIPTION OF THE DRAWINGS

Other characteristics and advantages of the invention will appear by reading a preferred method of construction with reference to the figures in the appendix, in which.

The same marks are used for the same element on each figure.

MORE DETAILED DESCRIPTION

Figure 1A:
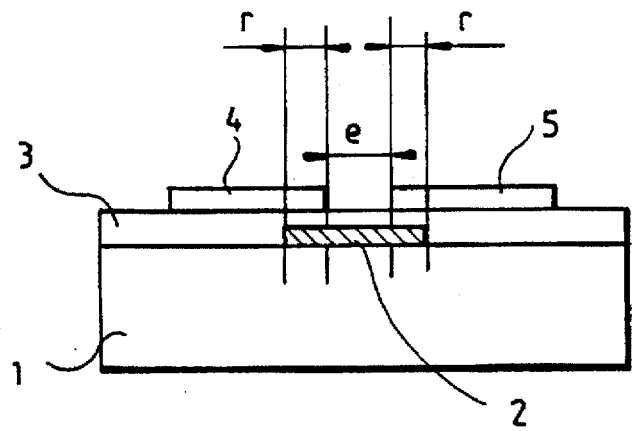
FIGS. 1A and 1B represent the sectional view and top view respectively of a magneto-resistive sensor according to prior art.
Figure 1B:
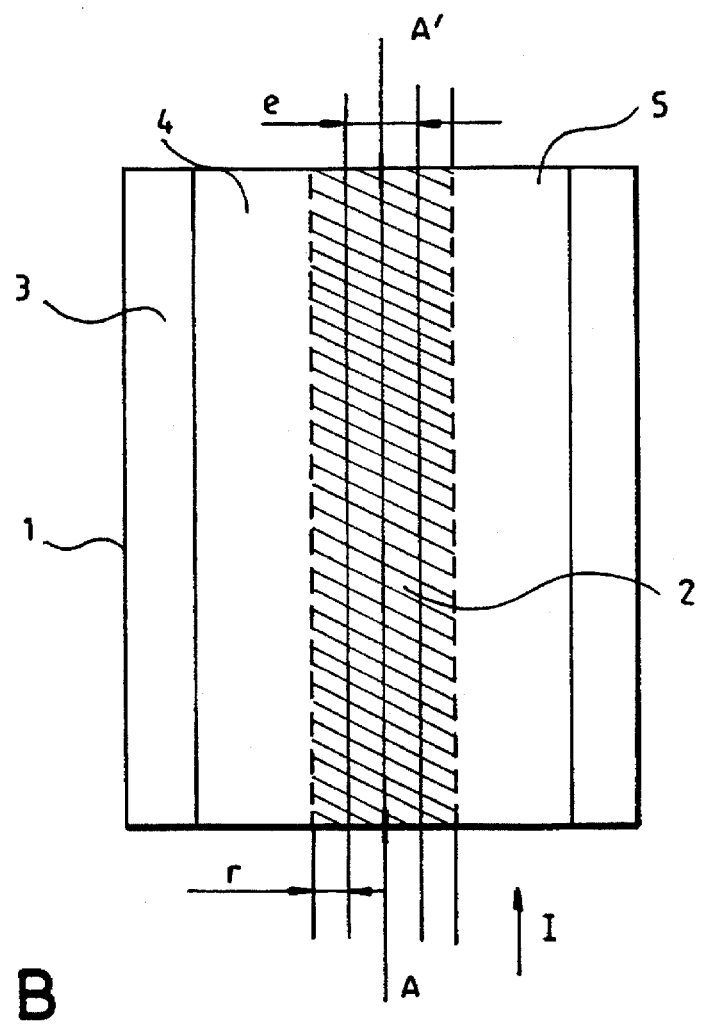

FIGS. 1A and 1B show a sectional view and a top view respectively of a magneto-resistive sensor according to prior art. On these figures, a magneto-resistive element 2 is located on a material support 1. This element may be deposited, for example, by cathodic spraying.

The thickness of the magneto-resistive element may, for example, be of the order of 25 nanometers. An insulating layer 3, for example a layer of metal oxide, covers the entire assembly consisting of the magneto-resistive element and the material support. Two pole pieces 4 and 5 are deposited on the insulating layer 3. The pole pieces are preferably made of a low-retentivity magnetic material, for example Sendust alloy. As mentioned previously, each of the two pole pieces partially overlaps the magneto-resistive element by a distance r, in order to improve the transmission of magnetic flux to this element. The two pole pieces, preferably rectangular, are placed parallel to each other. The distance between them, denoted e, forms the air gap of the magneto-resistive sensor. The current, I, passes through the magneto-resistive element 2. This current circulates along the direction of the line AA' that defines the air gap. When there is no variation in the magnetic field, the resistance of element 2 is equal to R. The detected voltage is then written as V=RI. If the magnetic field varies, the resistance of the magneto-resistive element also varies. The change in the detected voltage is then given by the formula $\Delta V = \Delta R \times I$ where $\Delta R$ represents the change in the resistance of the magneto-resistive element.

Figure 2:
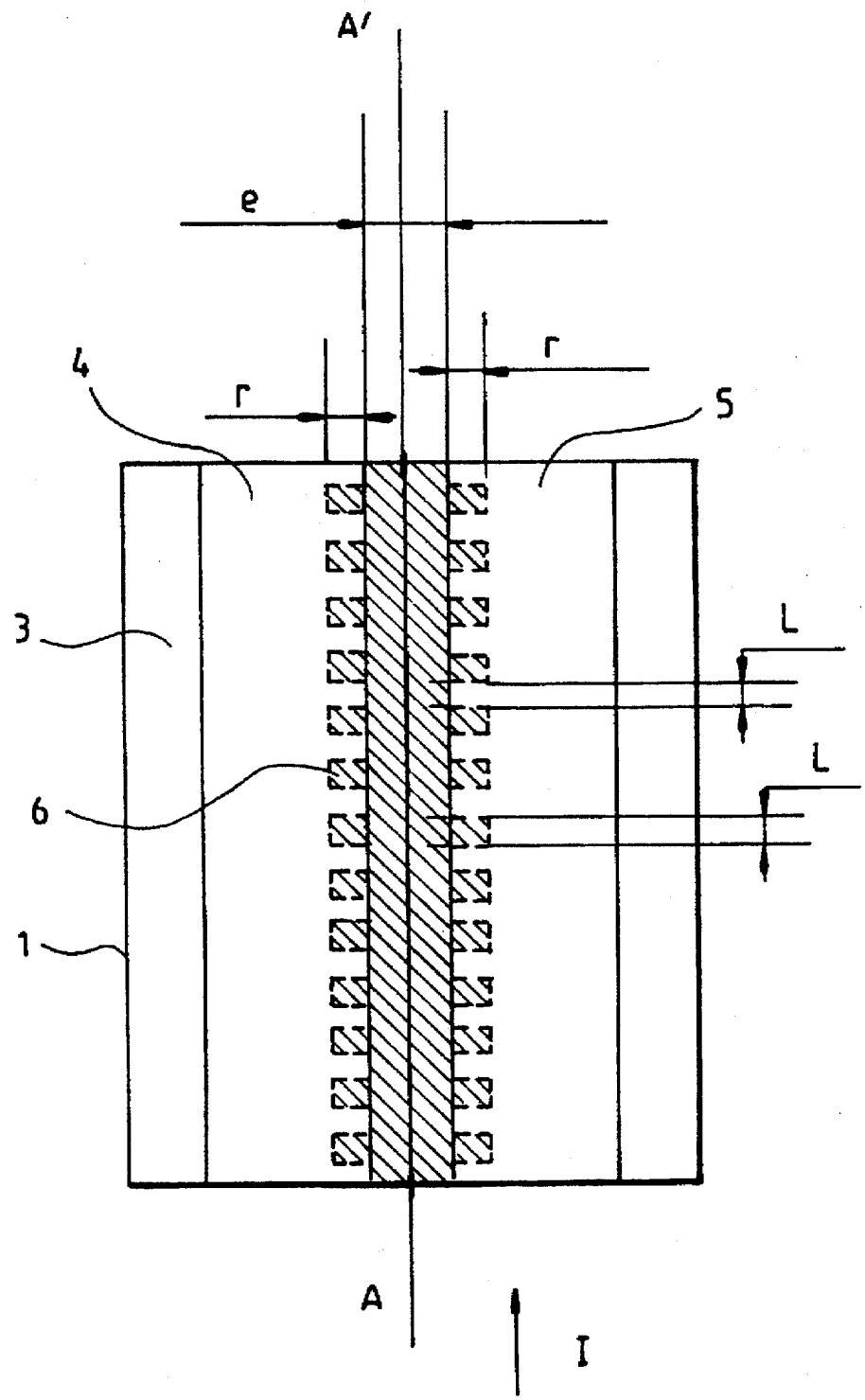
FIG. 2 shows the top view of a magneto-resistive sensor made according to the invention.

FIG. 2 shows a top view of a magneto-resistive sensor according to the invention.

The magneto-resistive element 2 is then castellated. The two parts of the magneto-resistive element that overlap with the pole pieces over a distance r each consist of a succession of castellations 6.

According to the invention, castellations 6 are laid out such that the current I only flows through the part of the magneto-resistive element located within the air gap. Preferably, the width of the castellations will be L and the spacing between two successive castellations will also be L. However, the invention is applicable to any other configuration that confines the current within the area of the magneto-resistive element located in the air gap.

Therefore the device according to the invention localizes the current solely within the area in which the magnetic field is concentrated.

It is useful if the sensitivity of the magneto-resistive sensor is improved. For example, a magneto-resistive sensor according to the invention, with an air gap e equal to 100 microns and with an overlap r of 10 microns, has a sensitivity gain of the order of 20% with respect to a magneto-resistive sensor according to prior art, in other words without castellations. Since no current passes through overlap zones r, another advantage of the current is that these zones can be extended in order to better collect the magnetic field.

Preferably, the production process for a device according to the invention includes the following main steps:

Deposit the magneto-resistive material on the surface of support 1 by cathodic spraying. As mentioned previously the thickness of the deposit could be, for example, 25 nanometers.

Install a mask, for example made of photosensitive resin, on the layer of magneto-resistive material. This mask has the same shape as the final magneto-resistive element. The width L could be, for example, equal to 10 microns.

Remove the magneto-resistive layer where it is not required.

Remove the mask.

Deposit an insulating layer 3, for example a metal oxide layer, by any method known to the expert in the field. For example, the thickness of the insulating layer could be 200 nanometers.

Deposit a layer of low-retentivity magnetic material or Sendust alloy over the entire previously deposited insulated layer.

Install a mask with the same dimensions as the pole pieces.

Engrave pole pieces.

When manufacturing a read head, the mask installed to define pole pieces is removed so that the magnetic field inscribed on the tape may be read under the optimum conditions. However, when manufacturing a magnetometer, the mask may remain in place since the field to be detected exists throughout the surrounding space.

Figure 3:
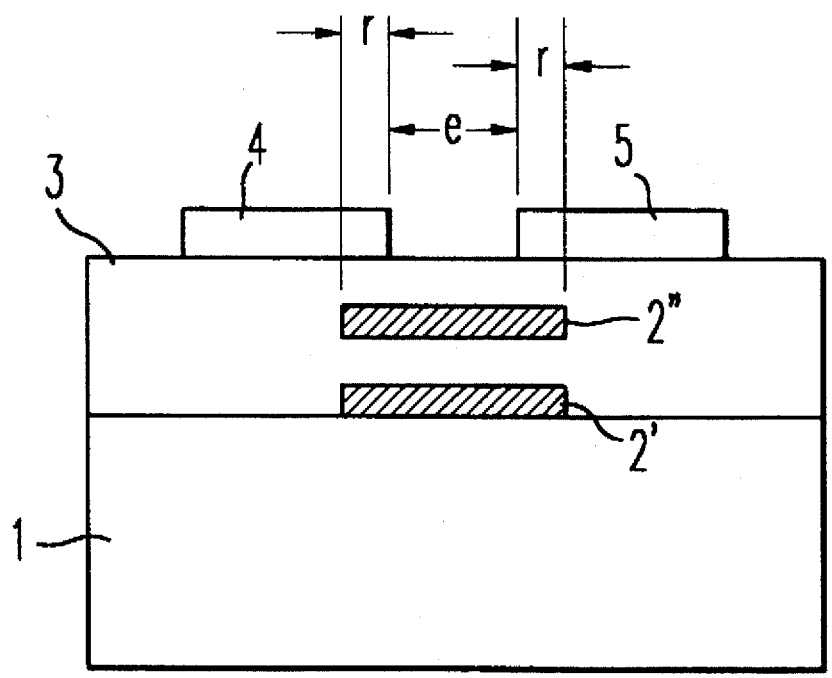
FIG. 3 represents the sectional view of a multi-layer magneto-resistive sensor.

As mentioned previously, the invention also concerns multi-layer magneto-resistive sensors. As is well-known to the expert in the field, the magneto-resistive element is then made by stacking at least two magnetic layers separated by a non-magnetic layer. The first step in the production process described above is then to deposit the successive layers necessary to build up the magneto-resistive element. FIG. 3 represents the sectional view of a multi-layer magneto-resistive sensor comprising two magneto-resistive layers 2' and 2" (the castellated portions are not shown).

In the preferred construction method described above, the magneto-resistive element is castellated only where the element overlaps with pole pieces. In other construction methods, the magneto-resistive element is castellated up to the zone located in the air gap.

What is claimed is:

1. A magneto-resistive magnetic sensor comprising:

a magneto-resistive element having a substantially planar surface portion;

two pole pieces separated by a gap and positioned proximally to said magneto-resistive element;

wherein the width of said gap is less than the width of said magneto-resistive element;

wherein the normal projection of said pole pieces onto said substantially planar portion of said magneto-resistive element comprises two disjoint areas of said magneto-resistive element; and wherein a current flowing through said magneto-resistive element does not substantially flow through said two disjoint areas.

2. A magnetic sensor as set forth in claim 1, wherein each area of said disjoint areas comprises a succession of castellations.

3. A magnetic sensor as set forth in claim 2, wherein said succession of castellations (6) comprises castellations of uniform size and spacing, wherein the width of said castellations is substantially equal to the width of said spacing.

4. A magnetic sensor as set forth in any of the preceding claims, wherein the magneto-resistive element is made of a single material.

5. A magnetic sensor as set forth in one of claims 1–3, wherein the magneto-resistive element is made by stacking a plurality of magnetic layers, each magnetic layer of said plurality of magnetic layers separated by a non-magnetic layer.

6. A magnetic sensor as set forth in claim 2, wherein said castellations extend substantially over the widths of said disjoint areas.

7. A magnetic sensor as set forth in claim 2, wherein a portion or portions of said castellations extend into an area of said magneto-resistive material between said disjoint areas.

* * * * *